Feb. 10, 1970 R. BRADLEY 3,495,138

SEMICONDUCTOR RECTIFIERS WITH EDGE-GEOMETRY FOR REDUCING LEAKAGE CURRENT

Filed Feb. 26, 1968

United States Patent Office 3,495,138
Patented Feb. 10, 1970

3,495,138

SEMI-CONDUCTOR RECTIFIERS WITH EDGE-GEOMETRY FOR REDUCING LEAKAGE CURRENT

Roger Bradley, Welton, Lincoln, England, assignor to Associated Electrical Industries Limited, London, England Filed Feb. 26, 1968, Ser. No. 708,102
Claims priority, application Great Britain, Mar. 8, 1967, 10,932/67
Int. Cl. H01l 3/00, 5/00, 11/00
U.S. Cl. 317—234 4 Claims

ABSTRACT OF THE DISCLOSURE

A semiconductor rectifier comprises a wafer of semiconductor material whose edges are bevelled. The wafer includes an outer surface region of higher conductivity than the next adjacent region, and the wafer edges over this interface are bevelled preferably at not more than 3° to the plane of the wafer, whereas the edges of the wafer over the PN junction between said next region and a layer of opposite conductivity material, are bevelled at a much larger angle, preferably of the order of 50°. Such bevelling reduces the potential gradient in the vicinity of the interfaces and increases the surface leakage path between the electrodes of the rectifier.

Background of the invention

Semiconductor rectifiers which are produced by diffusing impurity material characteristic of one conductivity type into a wafer of semiconductor material of the opposite conductivity type to form a PN junction therein may also be provided with a high conductivity surface region to which an external electrical contact can readily be made. One factor which limits the value of the inverse voltage which can be withstood without breakdown by such a semiconductor rectifier is the severe potential gradient which is formed where the PN junction penetrates the edge surface of the wafer. It is known to bevel the edge surface of the wafer in the vicinity of the exposed edge of the PN junction to reduce the electrical stresses at that point. A second factor where a high conductivity surface region is provided, is that there is an interface between this region and the underlying region of the same conductivity type and consequently there is also an abrupt change in potential gradient where this interface extends to the edge surface of the wafer when an inverse voltage is applied to the wafer.

Where an interface between two regions of the same conductivity type but different conductivity is inclined to an external surface such that the included acute angle is in the region which has lower conductivity than the angle is said to be positive. Conversely when the included angle is in the region which has higher conductivity the angle is said to be negative.

It is an object of the present invention to provide a semiconductor rectifier which is able to withstand a higher inverse voltage than known semiconductor rectifiers of the above type without breakdown.

Summary of the invention

According to the present invention a semiconductor rectifier comprises a wafer of semiconductor material having a pair of opposite substantially parallel faces, a PN junction extending substantially parallel to said faces between regions of P type and N type conductivity in the wafer, a surface region at one of said faces of the same conductivity type as but of higher conductivity than the region underlying it, with an interface between said underlying region and the surface region, which interface extends substantially parallel to said faces and wherein the external edge surfaces of the wafer are bevelled where said interface and said PN junction extend to the edge surfaces, the interface being inclined to the edge surfaces, at a negative included angle which is substantially less than and of the same sign as the included angle of inclination of the PN junction to said edge surface.

Brief description of the drawings

Referring to the drawing accompanying the provisional specification.

Figure 1:
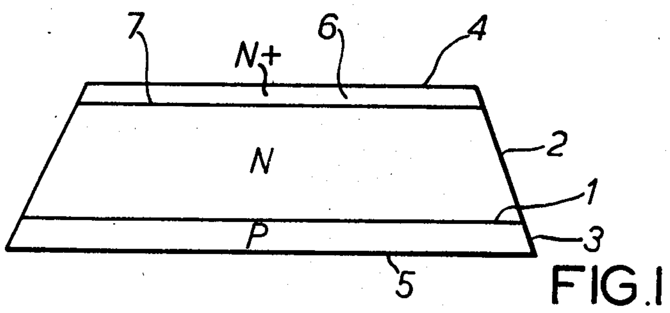
FIGURE 1 illustrates in side elevation a known semiconductor rectifier.
Figure 2:
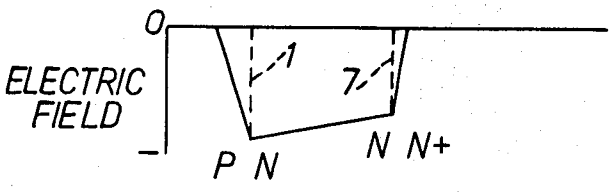
FIGURE 2 shows the electric field distribution across the rectifier shown in FIGURE 1 for an inverse voltage applied thereto.

The conventional semiconductor rectifier shown in FIGURE 1 has a PN junction 1 between an N type region 2 and a P type region 3 of a wafer of semiconductor material extending substantially parallel to the opposite faces 4 and 5 of the wafer. A more highly doped surface region 6, also of N type conductivity but of higher conductivity than the region 2 underlying it, is formed at the face 4 thereby providing an interface 7 between the N type region 2 and the N+ type surface region 6. In order to reduce the electric stress where the PN junction 1 extends to the external edge surfaces of the wafer when an inverse voltage is applied to the rectifier, these edges are bevelled. It can be seen from FIGURE 2 that under reverse bias conditions there is an abrupt change in potential gradient at the interface 7 between the N and N+ regions and this causes high stress conditions where the interface 7 extends to the edge surfaces of the wafer, thereby limiting undesirably the magnitude of the inverse voltage which can be withstood by the rectifier without breakdown occurring.

Description of the preferred embodiment

Figure 3:
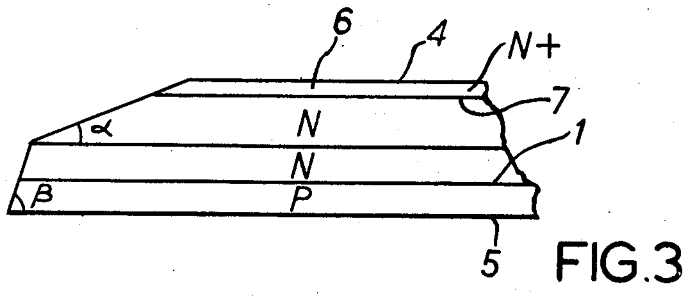
FIGURE 3 shows, by way of example, a side elevation of part of a semiconductor rectifier according to one embodiment of the present invention.

In the semiconductor rectifier according to the invention shown in FIGURE 3 the external edge surfaces of the wafer are bevelled at two distinct angles so that where the interface 7 extends to the edge surfaces of the wafer it is inclined to the said surfaces at a very small angle $\alpha$ (exaggerated in FIGURE 3 for the sake of clarity) which is preferably not more than 3°, the included acute angle being in the more highly doped N+ surface region 6 and being therefore negative. The PN junction 1 extends to the lateral edge surfaces of the wafer at an included angle $\beta$ which is of the same sign (i.e. negative) as the angle $\alpha$ but of considerably higher value.

The optimum value for the angle of bevel $\alpha$ is of the order of 1° while the thickness of the surface region 6 is preferably of the order of .001''. $\beta$ is the bevel angle normally employed to relieve stress across a PN junction and is typically of the order of 50°.

In addition to reducing the potential gradient in the vicinity of the N and N+ interface 7, bevelling the edge surfaces of the wafer in accordance with the present invention also increases the length of the surface leakage path between the electrodes of the rectifier which are in contact with the N+ and P regions respectively, thereby increasing the inverse voltage rating of the rectifier.

I claim:

1. A semiconductor rectifier comprising a wafer of semiconductor material having a pair of opposite substantially parallel faces, regions of P and N type conductivity in the wafer, a PN junction extending substantially parallel to said faces between said regions, a surface region surmounting one of said regions on one said :ace, said surface region being of the same conductivity ype as but of higher conductivity than the said one region, ın interface between said one region and the surface ·egion, which interface extends substantially parallel o said faces, and a bevelled edge surface where said nterface and said PN junction extend to the surface of he wafer, the interface being inclined to said edge sur- :ace at a negative included angle which is substantially ess than and of the same sign as the included angle of nclination of the PN junction to said edge surface.

2. A semiconductor rectifier as claimed in claim 1 vherein the said interface is inclined to the edge surface ıt a negative included angle of less than 3°.

3. A semiconductor rectifier as claimed in claim 2 vherein said negative included angle is substantially 1°.

4. A semiconductor rectifier as claimed in claim 1 wherein the negative included angle of inclination of the PN junction to said edge surface is substantially 50°.

References Cited

UNITED STATES PATENTS

| | | | |
|---|---|---|---|
| 2,672,528 | 3/1954 | Shockley | 317—235 X |
| 2,989,650 | 6/1961 | Doucette et al. | 307—88 |
| 3,179,860 | 4/1965 | Clark et al. | 317—234 |
| 3,226,268 | 12/1965 | Bernard | 317—234 X |
| 3,397,349 | 8/1968 | Clark | 317—234 |

JAMES D. KALLAM, Primary Examiner

U.S. Cl. X.R.

317—235